United States Patent
Kwak et al.

(10) Patent No.: US 12,463,525 B2
(45) Date of Patent: Nov. 4, 2025

(54) HIGH-SIDE N-TYPE POWER TRANSISTOR GATE DRIVING TECHNIQUES WITHOUT A BOOTSTRAP CAPACITOR

(71) Applicant: QUALCOMM Incorporated, San Diego, CA (US)

(72) Inventors: Taewoo Kwak, San Diego, CA (US); Joseph Dale Rutkowski, Chandler, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 148 days.

(21) Appl. No.: 17/934,487

(22) Filed: Sep. 22, 2022

(65) Prior Publication Data

US 2024/0106318 A1    Mar. 28, 2024

(51) Int. Cl.
*H02M 1/08*   (2006.01)
*H02M 3/158*  (2006.01)
*H03K 17/687* (2006.01)

(52) U.S. Cl.
CPC .......... *H02M 1/08* (2013.01); *H02M 3/1582* (2013.01); *H03K 17/6871* (2013.01); *H03K 2217/0063* (2013.01); *H03K 2217/0072* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247;
(Continued)

(56) References Cited

U.S. PATENT DOCUMENTS

| | | | |
|---|---|---|---|
| 8,531,212 B2 * | 9/2013 | Dewa .................. | H03K 17/063 327/108 |
| 9,100,019 B2 * | 8/2015 | Akiyama ............ | H03K 17/162 |

(Continued)

OTHER PUBLICATIONS

Partial International Search Report—PCT/US2023/073222—ISA/EPO—Dec. 8, 2023.
(Continued)

*Primary Examiner* — Jeffrey A Gblende
(74) *Attorney, Agent, or Firm* — Patterson + Sheridan, L.L.P.

(57) ABSTRACT

Techniques and apparatus for driving the gate of a high-side transistor in a switched-mode power supply (SMPS) circuit, such as an inverting buck-boost converter or a buck converter. One example technique to pull down the gate voltage of the high-side transistor involves a multi-step approach, in which the gate voltage is initially discharged to a lower voltage level, and once the gate voltage falls below a certain level, an auxiliary switch can take over to completely turn off the high-side transistor. One example SMPS circuit generally includes a high-side transistor, a pulldown gate driver having an output coupled to a gate of the high-side transistor, a pulse generator having an output coupled to an input of the pulldown gate driver, and a first switch coupled between the gate and a source of the high-side transistor.

18 Claims, 13 Drawing Sheets

(58) Field of Classification Search
CPC .......... G05F 3/262; G05F 3/265; G05F 3/267;
G05F 1/575; H02M 5/2573; H02M 1/081;
H02M 5/293; H02M 7/12; H02M 3/10;
H02M 3/125; H02M 3/13; H02M 3/135;
H02M 3/145; H02M 3/15; H02M 3/155;
H02M 3/156; H02M 3/157; H02M 3/158;
H02M 1/346; H02M 3/1588; H02M
2003/1566; H02M 3/1582; H02M 3/1584;
H02M 2003/1557; H02M 1/0032; H02M
1/4225; H02M 7/217; H02M 1/0025;
H02M 1/0045; H02M 1/0009; H02M
1/08; H02M 1/088; H02M 1/0048; H05B
39/048; B23K 11/24; H04B 2215/069
See application file for complete search history.

(56) References Cited

U.S. PATENT DOCUMENTS

| | | | | |
|---|---|---|---|---|
| 9,813,009 | B1 | 11/2017 | Xu et al. | |
| 10,122,279 | B2 * | 11/2018 | Zhang | H02M 1/08 |
| 10,122,294 | B2 * | 11/2018 | Xu | H02M 1/38 |
| 10,438,945 | B2 * | 10/2019 | Vielemeyer | H01L 27/088 |
| 11,296,601 | B2 * | 4/2022 | Kinzer | H02M 1/096 |
| 11,342,911 | B2 * | 5/2022 | Lee | H03K 17/063 |
| 11,901,888 | B1 * | 2/2024 | Chendake | H03K 17/687 |
| 2017/0054357 | A1 | 2/2017 | Chin et al. | |
| 2021/0126538 | A1 | 4/2021 | Puia et al. | |
| 2023/0387902 | A1 * | 11/2023 | Chen | H02M 3/158 |

OTHER PUBLICATIONS

International Search Report and Written Opinion—PCT/US2023/073222—ISA/EPO—Mar. 6, 2024.

* cited by examiner

HIGH-SIDE N-TYPE POWER TRANSISTOR GATE DRIVING TECHNIQUES WITHOUT A BOOTSTRAP CAPACITOR

TECHNICAL FIELD

Certain aspects of the present disclosure generally relate to electronic circuits and, more particularly, to a gate driver architecture and methods for gate driving in switched-mode power supplies.

BACKGROUND

A voltage regulator ideally provides a constant direct current (DC) output voltage regardless of changes in load current or input voltage. Voltage regulators may be classified as linear regulators or switching regulators. While linear regulators tend to be small and compact, many applications may benefit from the increased efficiency of a switching regulator (also referred to as a "switching converter"). A linear regulator may be implemented by a low-dropout (LDO) regulator, for example. A switching regulator may be implemented by a switched-mode power supply (SMPS), such as a buck converter, a boost converter, a buck-boost converter, or a charge pump.

For example, a buck converter is a type of SMPS typically comprising: (1) a high-side switch coupled between a relatively higher voltage rail and a switching node, (2) a low-side switch coupled between the switching node and a relatively lower voltage rail, (3) and an inductor coupled between the switching node and a load (e.g., represented by a shunt capacitive element). The high-side and low-side switches may be implemented with transistors, although the low-side switch may alternatively be implemented with a diode.

Power management integrated circuits (power management ICs or PMICs) are used for managing the power demands of a host system and may include and/or control one or more voltage regulators (e.g., buck converters or buck-boost converters). A PMIC may be used in battery-operated devices, such as mobile phones, tablets, laptops, wearables, etc., to control the flow and direction of electrical power in the devices. The PMIC may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide a switched-mode power supply (SMPS) circuit. The SMPS circuit generally includes a high-side transistor, a pulldown gate driver having an output coupled to a gate of the high-side transistor, a pulse generator having an output coupled to an input of the pulldown gate driver, and a first switch coupled between the gate and a source of the high-side transistor.

Certain aspects of the present disclosure provide a power management integrated circuit (PMIC) comprising at least a portion of an SMPS circuit described herein.

Certain aspects of the present disclosure provide a method of supplying power. The method generally includes pulling down a gate voltage of a high-side transistor in a SMPS circuit; and when the gate voltage is pulled down to a particular voltage level, closing a first switch to effectively short a gate and a source of the high-side transistor to turn off the high-side transistor.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 3A-1 and 3A-2 will be considered as FIG. 3A hereinafter.

FIGS. 3C-1 and 3C-2 will be considered as FIG. 3C hereinafter.

FIGS. 3D-1 and 3D-2 will be considered as FIG. 3D hereinafter.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
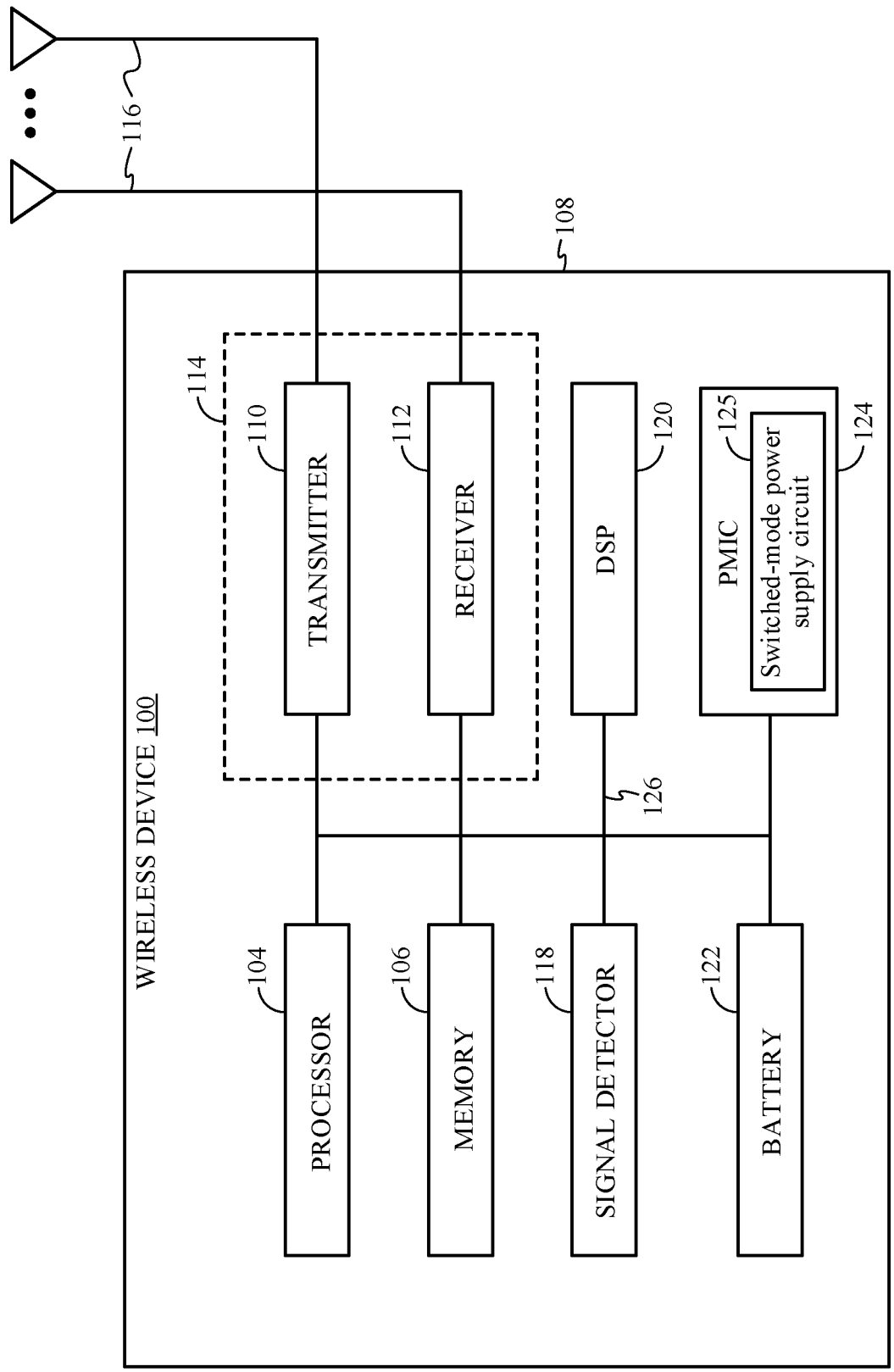
FIG. 1 is a block diagram of an example device that includes a switched-mode power supply (SMPS) circuit, in which aspects of the present disclosure may be practiced.

Certain aspects of the present disclosure provide techniques and apparatus for driving the gate of a high-side transistor in a switched-mode power supply (SMPS) circuit, such as an inverting buck-boost converter or a buck converter. One example technique to pull down the gate voltage of the high-side transistor involves a multi-step approach, in which the gate voltage is initially discharged to lower the voltage, and once the gate voltage falls below a certain level, an auxiliary switch can take over to completely turn off the high-side transistor.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCSs), personal digital assistants (PDAs), Internet of Things (IoT) devices, and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, an IoT device, a wearable device, an augmented reality device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a transmitter 110 and/or a receiver 112 to allow transmission and/or reception, respectively, of data between the device 100 and a remote location. For certain aspects, the transmitter 110 and receiver 112 may be combined into a transceiver 114. One or more antennas 116 may be attached or otherwise coupled to a housing 108 of the device 100 and electrically coupled to the transceiver 114. For certain aspects, the device 100 may include multiple transmitters, multiple receivers, and/or multiple transceivers (not shown).

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. For certain aspects, the battery 122 may be rechargeable.

The device 100 may also include a power management integrated circuit (PMIC) 124 (also referred to as a "power management unit (PMU)") for managing the power from the battery to the various components of the device 100. The PMIC 124 may perform a variety of functions for the device, such as DC-to-DC conversion, battery charging, power-source selection, voltage scaling, power sequencing, etc. In certain aspects, the PMIC 124 may include at least a portion of a power supply circuit, which may include a switched-mode power supply (SMPS) circuit 125. The SMPS circuit 125 may be implemented by any of various suitable switched-mode power supply circuit topologies, such as a buck converter, a boost converter, an inverting buck-boost converter, or a charge pump. For certain aspects, the SMPS circuit 125 may include a high-side gate driver architecture with a pulse generator, a pulldown gate driver having an input coupled to an output of the pulse generator and an output coupled to a gate of a high-side transistor, and one or more switches coupled between the gate and a source of a high-side transistor, as described below. For certain aspects, the PMIC 124 may include a battery charging circuit (e.g., a master-slave battery charging circuit) for charging the battery 122.

The various components of the device 100 may be coupled together by a bus system 126, which may include a power bus, a control signal bus, and/or a status signal bus in addition to a data bus.

Example Power Supply Circuit with a Gate Driver and a Switching Circuit

Figure 2A:
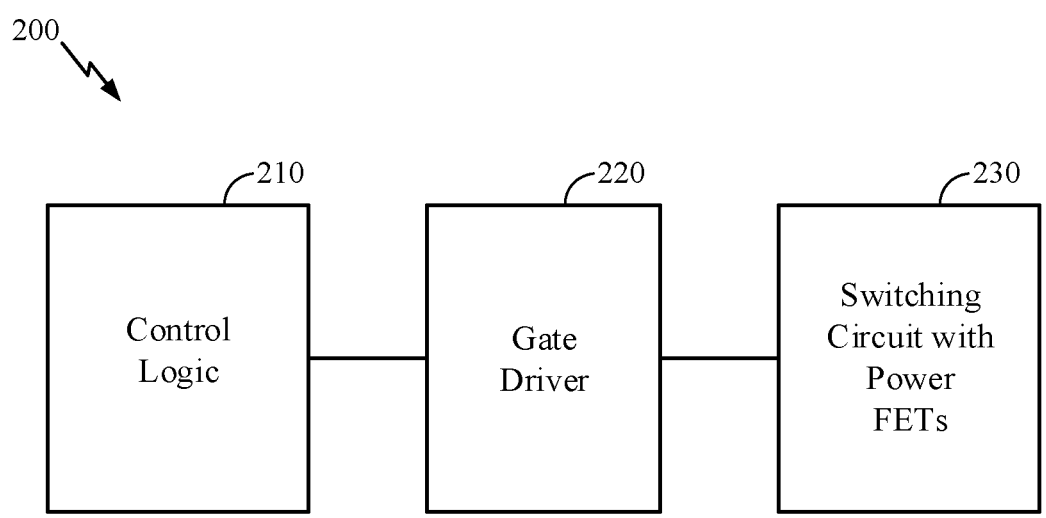
FIG. 2A is a block diagram of an example SMPS circuit, in which aspects of the present disclosure may be practiced.

FIG. 2A is a block diagram of an example switched-mode power supply (SMPS) circuit 200, in which aspects of the present disclosure may be practiced. The SMPS circuit 200 may include control logic 210, a gate driver 220, and a switching circuit 230. The control logic 210 may output control signals to control the timing of components in the gate driver 220. The gate driver 220 may output signals with specified output signal swings to control the control inputs (e.g., the gates) of switching devices (e.g., power field-effect transistors (FETs)) in the switching circuit 230. The gate driver 220 may be powered from any of various suitable power supply voltages.

Figure 2B:
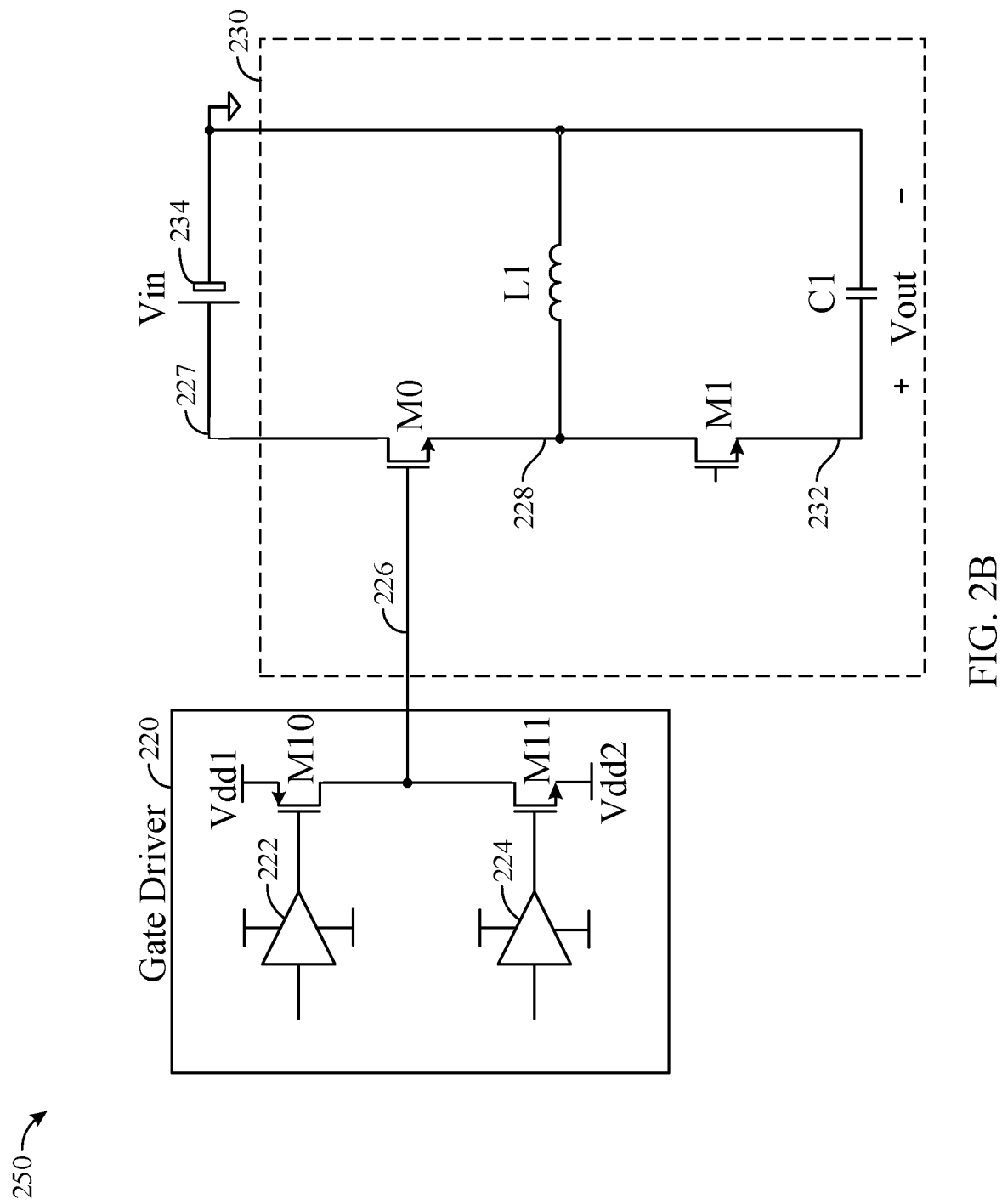
FIG. 2B is a circuit diagram of an example gate driver and an example inverting buck-boost converter, in which aspects of the present disclosure may be practiced.

FIG. 2B is a circuit diagram 250 of a portion of an example gate driver 220 and an example switching circuit 230, in which aspects of the present disclosure may be practiced. The gate driver 220 may include logic buffers 222, 224 and switches, which may be implemented by transistors M10 and M11, as shown. Logic buffer 222 may have an input coupled to an output of the control logic 210 and may have an output coupled to a control input of transistor M10. In this example, transistor M10 is implemented as a p-type field-effect transistor (PFET) having a source coupled to a first voltage rail (labeled "Vdd1"), having a gate coupled to the output of logic buffer 222, and having a drain coupled to an output node 226 of this portion of the gate driver 220. Logic buffer 224 may have an input coupled to another output of the control logic 210 and may have an output coupled to a control input of transistor M11. In this example, transistor M11 is implemented as an n-type field-effect transistor (NFET) having a drain coupled to the output node 226 of this portion of the gate driver 220, having a gate coupled to the output of logic buffer 224, and having a source coupled to a second voltage rail (labeled "Vdd2") with a lower voltage than the first voltage rail (Vdd1). The power supply inputs of logic buffers 222, 224 may be coupled to the first and second voltage rails, or may be coupled to one or more different power supply rails.

In this example, the switching circuit 230 is implemented as an inverting buck-boost converter. However, it is to be understood that the switching circuit may alternatively be implemented as any of other various suitable switching converter topologies, such as a boost converter or a buck converter. As illustrated, the inverting buck-boost converter includes power transistors M0, M1, an inductive element L1 (e.g., implemented by one or more inductors), and a capacitive element C1 (e.g., implemented by one or more capacitors). The high-side transistor M0 is an NFET having a drain coupled to an input node 227 (also referred to herein as an "input voltage node") of the inverting buck-boost converter (having voltage Vin provided by a power supply 234), having a gate coupled to an output of the gate driver 220 (namely, output node 226), and having a source coupled to a switching node 228 (also referred to herein as a "switching voltage (VSW) node"). The low-side transistor M1 is also an NFET having a drain coupled to the switching node 228, having a gate coupled to another output of the gate driver 220 (not shown in FIG. 2B), and having a source coupled to an output node 232 (also referred to herein as an "output voltage node") of the inverting buck-boost converter (having voltage Vout). The portion of the gate driver 220 (e.g., the low-side gate driver) for controlling the control input of the low-side transistor M1 is not illustrated, but may be implemented in a similar manner to that described above for the portion of the gate driver 220 (e.g., the high-side gate driver) for controlling the control input of the high-side transistor M0. For certain aspects, transistor M1 may be replaced with another suitable component, such as a diode with an anode coupled to the output node 232 and a cathode coupled to the switching node 228.

A first terminal of the inductive element L1 is coupled to the switching node 228, and a second terminal of the inductive element L1 is coupled to a reference potential node (e.g., electrical ground) of the inverting buck-boost converter. A first terminal of the capacitive element C1 is coupled to the output node 232, and a second terminal of the capacitive element C1 is coupled to the reference potential node. The output voltage Vout of the inverting buck-boost converter is developed across the capacitive element C1, as shown. In an inverting buck-boost converter, Vout generally has opposite polarity to Vin and is adjustable (e.g., between −3 V and −10 V) based on the duty cycle of the switching transistors M0 and M1.

During operation, logic buffers 222, 224 may receive control signals from the control logic (e.g., lower amplitude logic-level signals) and generate signals for driving the control inputs (e.g., the gates) of transistors M10, M11. In certain aspects, the buffer output signals may have higher voltage swings than the control signals received from the control logic 210. In this manner, the output signal from the gate driver 220 on the output node 226 may be pulled up to turn on power transistor M0 and may be pulled down to turn off transistor M0, according to the switching frequency and duty cycle of the inverting buck-boost converter. Likewise, another output signal from the gate driver 220 may be used to control operation of the power transistor M1, where the gate may be pulled up to turn on transistor M1 and may be pulled down to turn off transistor M1. The gate signals may be operated in a break-before-make fashion, such that transistor M0 is turned off before transistor M0 is turned on, and vice versa. As explained above, Vout is controlled based on the duty cycle of switching the power transistors M0 and M1.

The gate drive signal from the gate driver 220 may likely exceed Vin (e.g., by 5 V) at the drain of transistor M0 in order to turn this n-type transistor on sufficiently. And in order to fully turn off transistor M0, the gate drive signal may be driven at least as low as the switching voltage (VSW) at the source of this n-type transistor. Thus, the output node 226 should be driven (by the gate driver 220) to Vin plus some additional voltage (e.g., 5 V) and down to VSW (which may go to −10V, for example). So, if Vin is +5 V, then the gate may be driven with swings between +10 V and −10 V. This voltage swing may be challenging, especially in trying to keep transistor M0 off in an inverting buck-boost converter.

Example Gate Driver for the High-Side Transistor with a Bootstrap Capacitor

Figures 1, 3A:
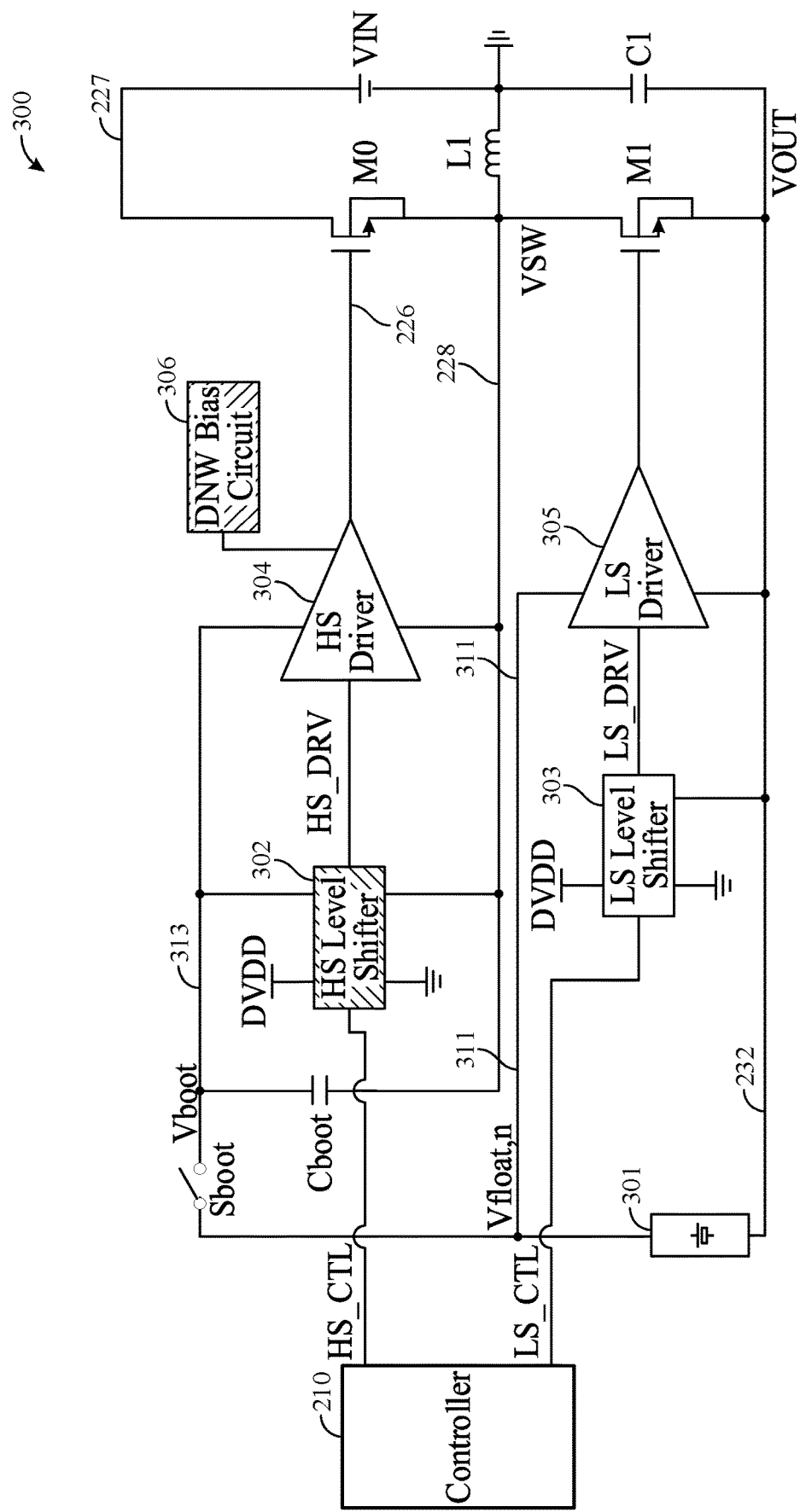
FIG. 3A is a circuit diagram (in FIG. 3A-1) of an example gate driver architecture for an inverting buck-boost converter, using a bootstrap capacitor to power a high-side gate driver, and a corresponding timing diagram (in FIG. 3A-2).
Figures 2, 3A:
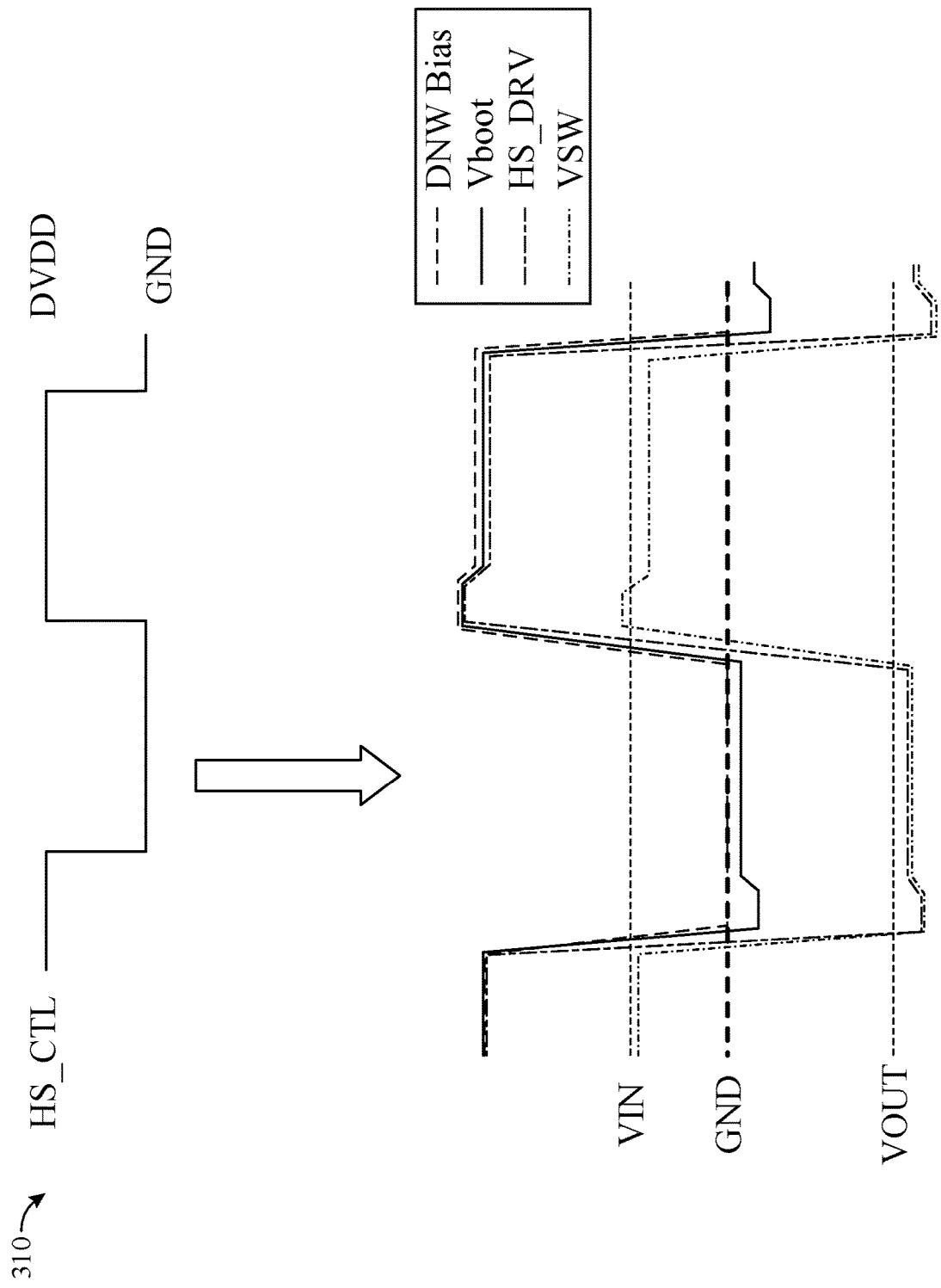

FIG. 3A is a circuit diagram 300 of an inverting buck-boost converter, an example implementation of a gate driver, and a corresponding timing diagram 310. The inverting buck-boost converter is similar to the inverting buck-boost converter of FIG. 2B and uses the same reference numerals.

The gate driver of FIG. 3A includes a floating rail generator 301, a switch Sboot, a bootstrap capacitor Cboot, a high-side (HS) level shifter 302, a low-side (LS) level shifter 303, a HS gate driver 304, and a LS gate driver 305. The gate driver may also include a deep n-well (DNW) bias circuit 306.

The floating rail generator 301 may be a voltage source (e.g., a power supply circuit) configured to generate a floating voltage (Vfloat,n) referenced from Vout, where Vfloat,n may be about 3 to 5 V higher than Vout, for example, to provide a sufficient gate-to-source voltage (Vgs) to turn on transistor M1. The higher the floating voltage Vfloat,n is, the higher the Vgs the LS gate driver 305 can apply to transistor M1, and the lower the drain-to-source on-resistance RDs,on that can be achieved. For certain aspects, if Vout is −10 V, then Vfloat,n may be −5 V, as an example. The floating rail generator 301 is coupled between the output node 232 and a floating power supply rail 311.

The LS level shifter 303 and the LS gate driver 305 may each have power inputs coupled between the floating power supply rail 311 and the output node 232 to receive power from the floating rail generator 301. The LS level shifter 303 has an input coupled to an output of the control logic 210 for receiving a low-side control signal (labeled "LS_CTL"). The LS level shifter 303 may also have separate power inputs coupled between a digital voltage rail (labeled "DVDD") and a (digital-domain) electrical ground, as shown in FIG. 3A. In this manner, the LS level shifter 303 can level shift a logic level signal (LS_CTL)—received from the control logic 210 and swinging from 0 V to DVDD—to a LS drive signal (labeled "LS_DRV") swinging from Vout to Vfloat,n. The LS gate driver 305 has an input coupled to an output of the LS level shifter 303 and has an output coupled to the gate of low-side transistor M1. In this manner, the gate of transistor M1 can be driven with a control signal swinging from Vout to Vfloat,n, which should be sufficient to turn off or turn on transistor M1.

In FIG. 3A, the switch Sboot is coupled between the floating power supply rail 311 and a first terminal of the bootstrap capacitor Cboot. A second terminal of capacitor Cboot is coupled to the switching node 228 with switching voltage VSW. By selectively charging the bootstrap capacitor Cboot from Vfloat,n through the switch Sboot (e.g., when the high-side transistor M0 is off and VSW is low), a bootstrap power supply rail 313 with floating bootstrap voltage Vboot is generated, referenced from VSW. Therefore, the Vboot domain moves dynamically with VSW. With bootstrapping, Vboot may rise as high as VIN plus the voltage across the floating rail generator 301 when the transistor M0 is on, as shown by the waveform for Vboot in the timing diagram 310. When transistor M0 is off, Vboot falls due to VSW falling.

The HS level shifter 302 and the HS gate driver 304 may each have power inputs coupled between the bootstrap power supply rail 313 and the switching node 228 to receive power from capacitor Cboot when the switch Sboot is open, and to receive power from the floating rail generator 301 when the switch Sboot is closed. The HS level shifter 302 has an input coupled to an output of the control logic 210 for receiving a high-side control signal (labeled "HS_CTL"). The HS level shifter 302 may also have separate power inputs coupled between the digital voltage rail (DVDD) and the (digital-domain) electrical ground, similar to the LS level shifter 303. In this manner, the HS level shifter 302 can level shift a logic level signal (HS_CTL)—received from the control logic 210 and swinging from 0 V to DVDD—to a HS drive signal (labeled "HS_DRV") swinging from VSW to Vboot, as illustrated in the timing diagram 310. The HS gate driver 304 has an input coupled to an output of the HS level shifter 302 and has an output coupled to the gate of high-side transistor M0. In this manner, the gate of transistor M0 can be driven with a control signal swinging from VSW to Vboot.

Figure 3B:
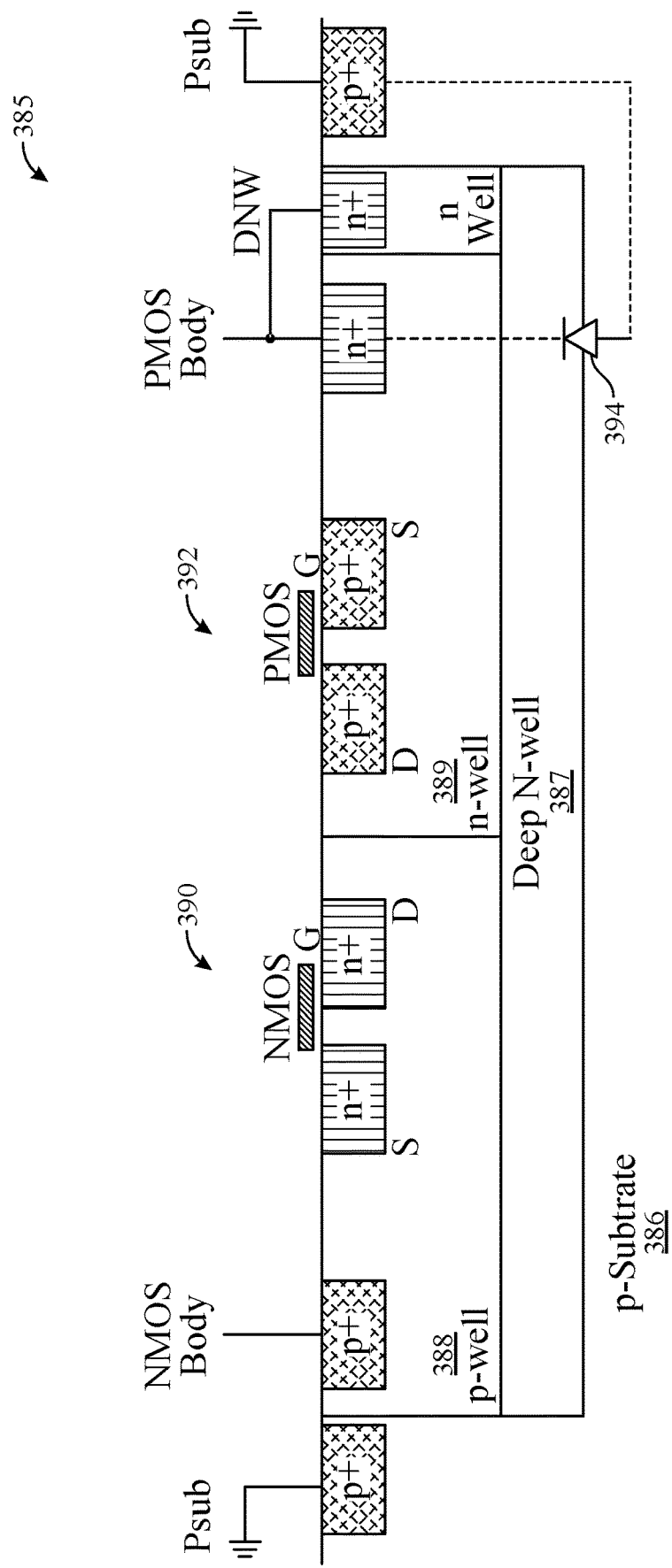
FIG. 3B is a cross-section of an example semiconductor fabricated using a triple well process.

As described above with respect to FIG. 2B, the HS gate driver 304 (and/or the LS gate driver 305) may include a p-type metal-oxide-semiconductor (PMOS) transistor (e.g., transistor M10) and an n-type metal-oxide-semiconductor (NMOS) transistor (e.g., transistor M11). For certain aspects, the gate driver may be fabricated using a triple well semiconductor process, as illustrated in the cross-section of an example semiconductor 385 in FIG. 3B. The semiconductor 385 includes a p-substrate 386, a deep n-well 387, a p-well 388, and an n-well 389. Doping is used to fabricate an NMOS transistor 390 above the p-well 388 (with n+-doped areas for the source (S) and drain (D)) and a PMOS transistor 392 above the n-well 389 (with p+-doped areas for the source (S) and drain (D)). The PMOS transistor 392 has deep n-well isolation (but may have no other isolation), and the deep n-well 387 is sitting on the p-substrate 386. The body of the PMOS transistor 392 may be n+ doped and may be shorted to the deep n-well 387, as shown in FIG. 3B. This n-well should not go negative when the PMOS gate (G) is swinging negative, lest the body diode 394 from the p-substrate 386 become forward biased, which can cause latch-up. To avoid latch-up (and forward biasing the body diode), the PMOS gate voltage may be effectively clamped at some voltage level (e.g., ≥0 V). Thus, if the gate driver is swinging down to the negative voltage domain, the body connections may be isolated, and a separate reference or power supply voltage may be provided in order to prevent the latch-up effect.

Therefore, the gate driver architecture of FIG. 3A may also include the DNW bias circuit 306 having an output coupled to the PFET transistor body in the HS gate driver 304. The DNW bias circuit 306 may provide a separate supply for the body to prevent latch-up.

In an inverting buck-boost converter such as illustrated in the circuit diagram 300, there are several design challenges associated with driving the high-side n-type transistor M0. The HS gate driver 304 is referenced to VSW, which may typically be switching very fast from a negative voltage domain (VOUT) to a positive voltage domain (VIN), as illustrated by the waveform for VSW in the timing diagram 310. For example, VSW may swing from −10 V to +10 V and back in some converters, slewing in 1 to 3 ns in some cases. The floating voltage source Vboot in this topology may call for a large capacitor Cboot to supply charge to the HS level shifter 302 and the HS gate driver 304 (e.g., when the switch Sboot is open). Due to this large size, the bootstrap capacitor Cboot may be external to the integrated circuit (e.g., a PMIC) with remaining components of the inverting buck-boost converter and may take up some substantial area in a device with the converter. Moreover, using Vfloat,n (from the floating rail generator 301 referenced from Vout) to charge capacitor Cboot may be inefficient, and there may be issues recharging capacitor Cboot during a high-impedance state (e.g., when both transistors M0, M1 are off and VSW is 0 V), during startup, during a pulse-skipping mode, when the HS driver is not switching, or over time. Furthermore, the design of the HS level shifter 302 may be challenging, because HS_DRV swings between negative and positive voltage domains with the HS level shifter's power supply inputs (Vboot and VSW) moving together. It may be a design challenge to prevent the HS level shifter 302 from losing its state when in the midst of a transition between the negative and positive domains. Furthermore, deep n-well (DNW) biasing may also be challenging in an inverting buck-boost converter for the same reasons, where the DNW bias voltage should be positive (e.g., clamped to >0 V) to prevent a parasitic diode (e.g., body diode 394) from being forward biased in the triple well process of FIG. 3B.

Figures 1, 3C:
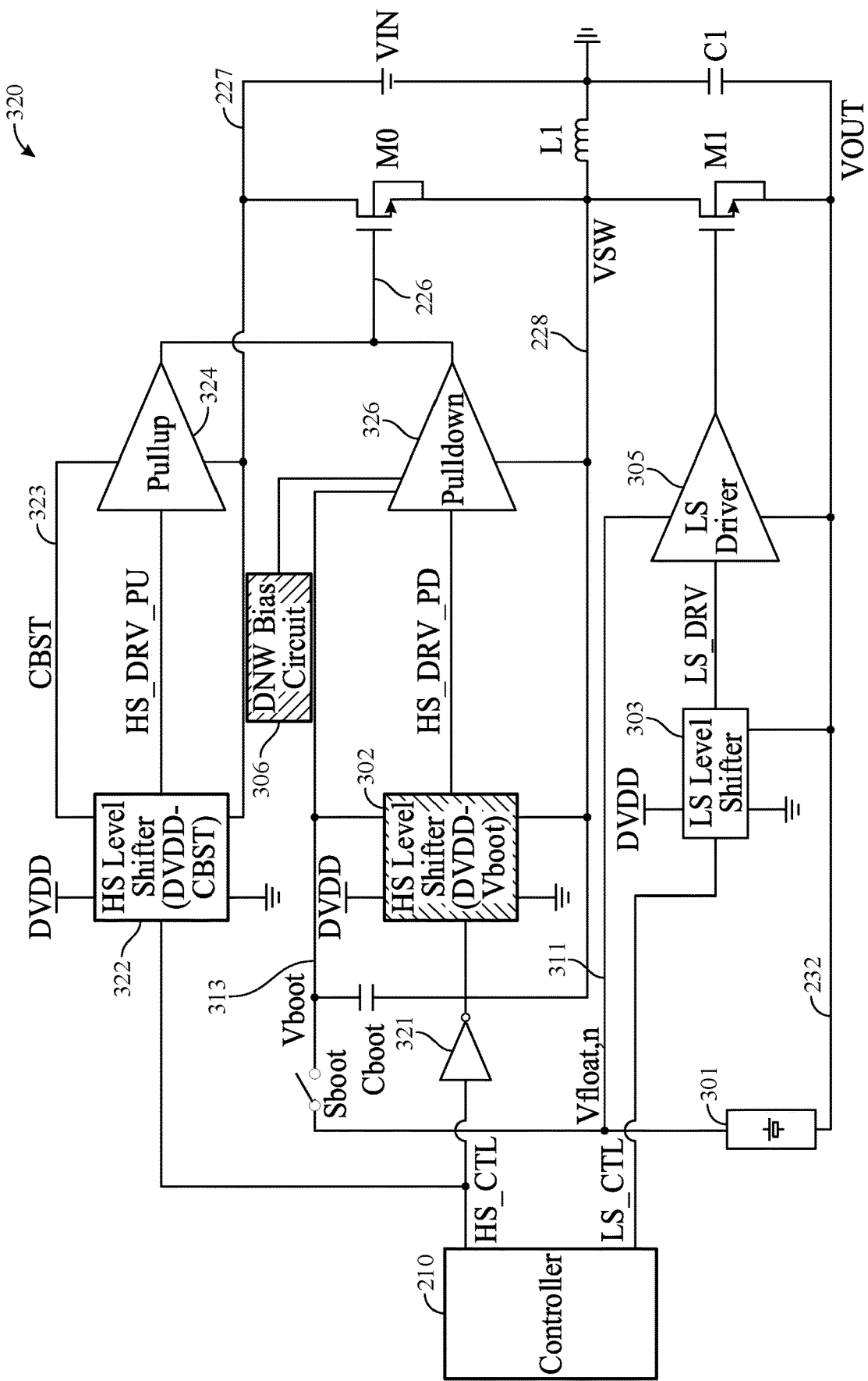
FIG. 3C is a circuit diagram (in FIG. 3C-1) of an example gate driver architecture for an inverting buck-boost converter, using a bootstrap capacitor to power a pulldown portion of a segmented high-side gate driver, and a corresponding timing diagram (in FIG. 3C-2).
Figures 2, 3C:
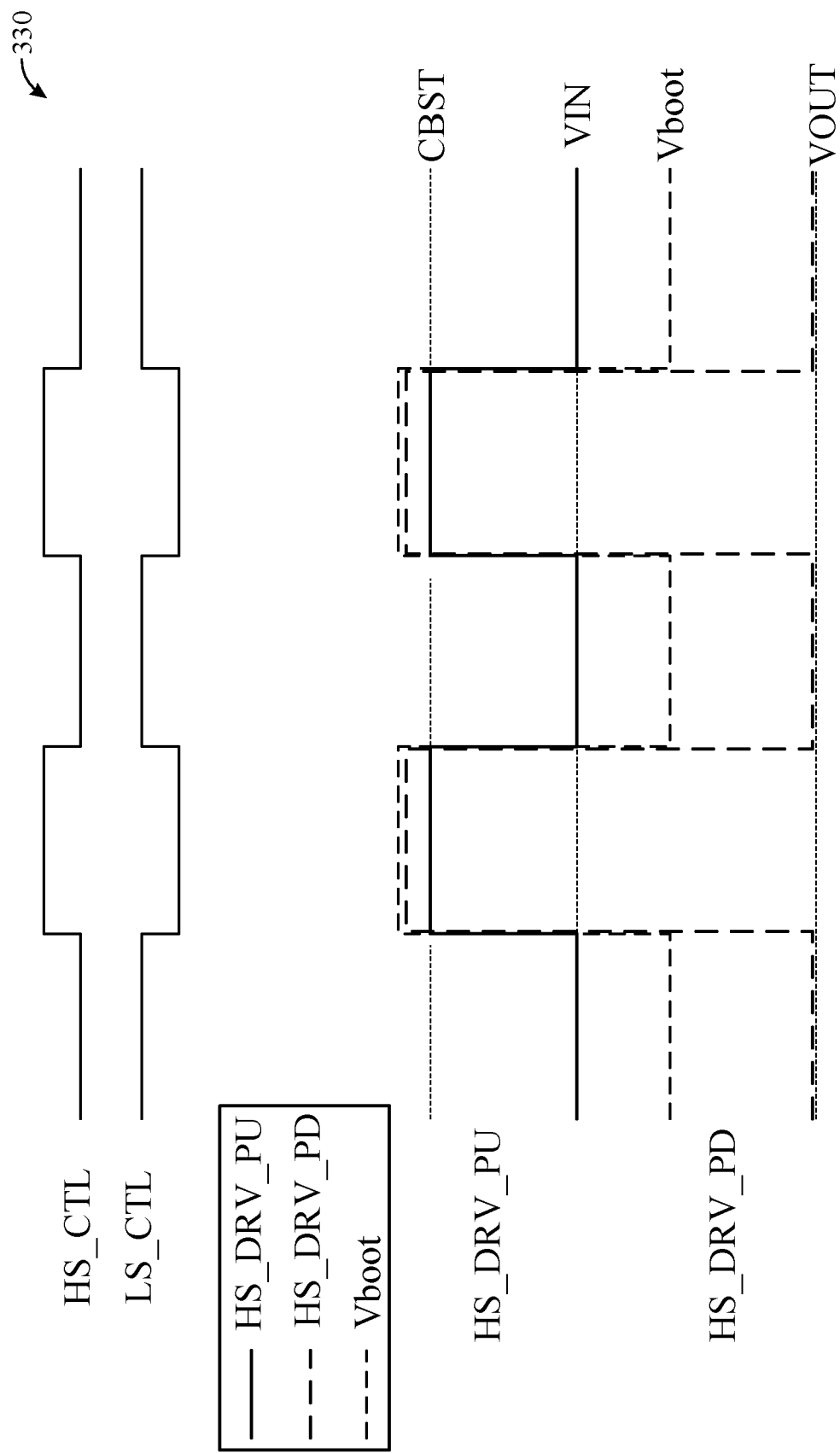

FIG. 3C is a circuit diagram 320 of another example gate driver architecture for the inverting buck-boost converter of FIGS. 2B and 3A and a corresponding timing diagram 330. Much of the circuit diagram 320 of FIG. 3C is similar to the circuit diagram 300 of FIG. 3A, uses the same reference numerals, and will not be described again.

The main difference between the circuit diagrams 300 and 320 is that the HS gate driver has been divided in FIG. 3C into a HS pullup gate driver 324 and a HS pulldown gate driver 326 (referred to as a "segmented HS gate driver"), each operating with different power supply domains, but having outputs coupled to the gate of transistor M0. The pullup driver 324 may act as a buffer with no pulldown capability, whereas the pulldown driver 326 may act as an inverting buffer with no pullup capability. For example, the pullup driver 324 may be implemented by an inverter having an output coupled to a gate of a p-type field-effect transistor (PFET). In contrast, the pulldown driver 326 may be implemented by two cascaded inverters having an output coupled to a gate of an-type field-effect transistor (NFET).

In addition to the segmented HS gate driver, the gate driver architecture of FIG. 3C also includes segmented level shifters: the HS level shifter 302 and another HS level shifter 322. An input of the HS level shifter 322 is coupled to the output of the control logic 210 for receiving HS_CTL, whereas an input of the HS level shifter 302 may be coupled to the output of the control logic 210 via an inverter 321. In this case, an input of the inverter 321 is coupled to the output of the control logic 210 for receiving the HS_CTL signal, and an output of the inverter 321 is coupled to the input of the HS level shifter 302. An output of HS level shifter 322 is coupled to an input of the pullup driver 324, and an output of HS level shifter 302 is coupled to an input of the pulldown driver 326.

Here, the pulldown driver 326 and the HS level shifter 302 may each have power inputs coupled between the bootstrap power supply rail 313 and the switching node 228 to receive power from capacitor Cboot when the switch Sboot is open, and to receive power from the floating rail generator 301 when the switch Sboot is closed, similar to that described above for the HS gate driver 304 and the HS level shifter 302 of FIG. 3A. However, the HS level shifter 322 and the pullup driver 324 receive power from a different power supply domain.

For certain aspects, a power supply circuit (e.g., a boost converter) referenced from Vin or another suitable voltage may be used to generate a voltage (labeled "CBST") that is greater than Vin (e.g., by 3 to 5 V, such as by 4 V) on a boosted power supply rail 323. In this case, the HS level shifter 322 and the pullup driver 324 may each have power inputs coupled between the boosted power supply rail 323 and the input node 227 with Vin. The HS level shifter 322 may also have separate power inputs coupled between the digital voltage rail (DVDD) and the (digital-domain) electrical ground, similar to the HS level shifter 302 and the LS level shifter 303. In this manner, the HS level shifter 322 can level shift a logic level signal (HS_CTL)—received from the control logic 210 and swinging from 0 V to DVDD—to a HS pullup drive signal (labeled "HS_DRV_PU") swinging from Vin to CBST, as illustrated in the timing diagram 330. Vin and CBST are DC voltages and do not track VSW.

Furthermore, the HS level shifter 302 can level shift HS_CTL to a HS pulldown drive signal (labeled "HS_DRV_PD") swinging from VSW to Vboot, as illustrated in the timing diagram 330. In this manner, the gate of transistor M0 can be pulled up by the pullup driver 324 to CBST (when HS_CTL is logic high) and pulled down by the pulldown driver 326 to VSW (when HS_CTL is logic low).

With the segmented gate driver of FIG. 3C, the bootstrap capacitor Cboot may be significantly reduced in size and capacitance compared to the capacitor Cboot of FIG. 3A. This is because the bootstrap capacitor Cboot of FIG. 3C is used to bias the HS level shifter 302, rather than actually providing power into the gate of transistor M0 as in FIG. 3A. Therefore, capacitor Cboot may be implemented as an internal capacitor in an integrated circuit for the switching regulator using the topology of FIG. 3C. However, Vfloat,n is still used to charge capacitor Cboot, which may be inefficient. Furthermore, the design of the HS level shifter 302 on the Vboot domain and the DNW biasing design are still challenging with this implementation.

Example Gate Driver for the High-Side Transistor without a Bootstrap Capacitor

Certain aspects of the present disclosure provide apparatus and techniques for driving the gate of a high-side power transistor in a switching regulator using a segmented driver where the pulldown has a two-step approach. In this approach, the high-side gate voltage is pulled down using the output voltage domain instead of the VSW domain to a certain voltage, below which an auxiliary switch can take over to completely turn off the high-side transistor. This two-step transition may be accomplished by introducing a pulse generator and an auxiliary switch to the high-side pulldown path of the gate driver architecture and by powering the HS level shifter, pulse generator, and HS pulldown gate driver from rails at Vfloat,n and Vout.

Figures 1, 3D:
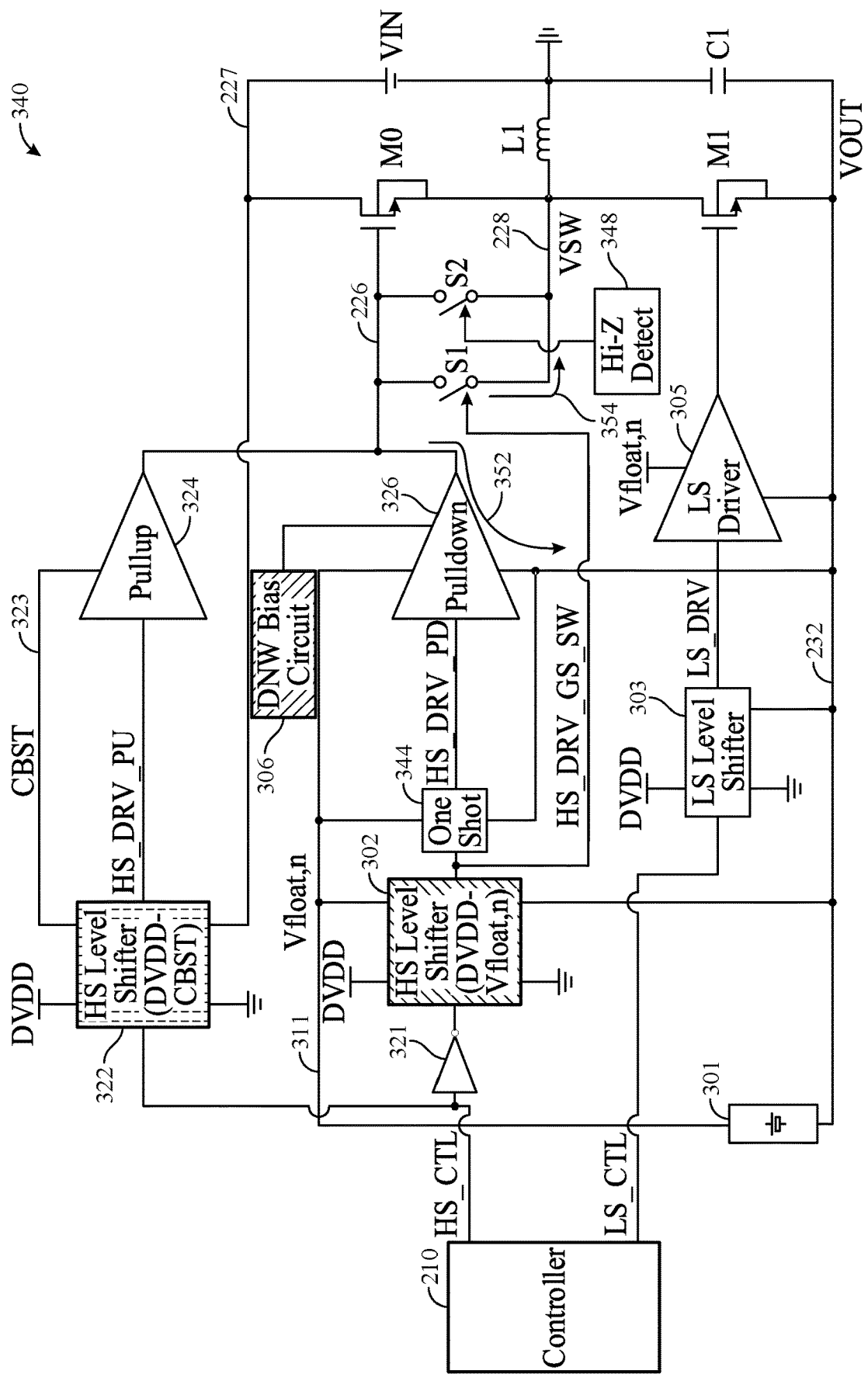
FIG. 3D is a circuit diagram (in FIG. 3D-1) of an example gate driver architecture for an inverting buck-boost converter, using a pulse generator and one or more auxiliary switches, and a corresponding timing diagram (in FIG. 3D-2), in accordance with certain aspects of the present disclosure.
Figures 2, 3D:
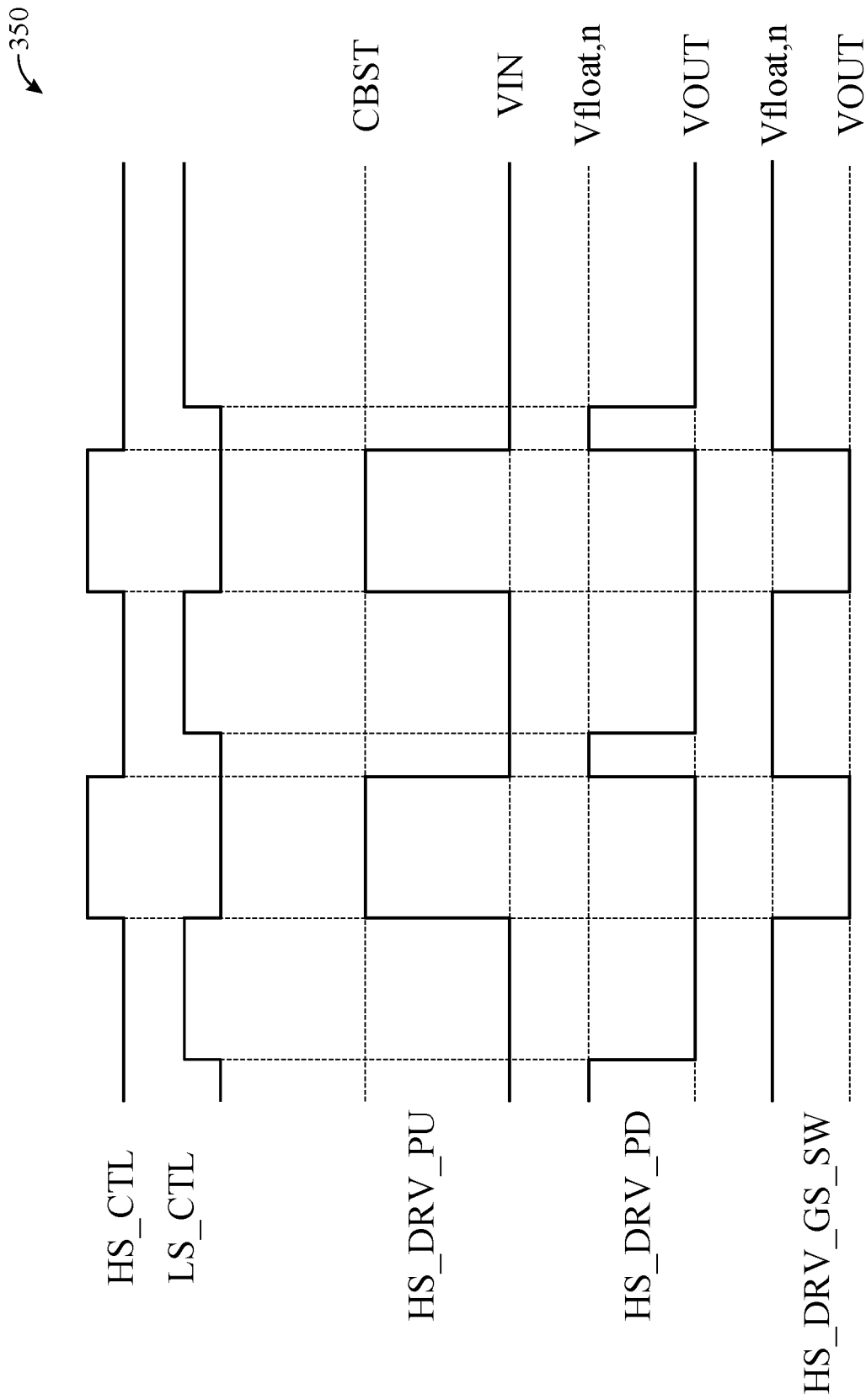

FIG. 3D is a circuit diagram 340 of an example gate driver architecture for the inverting buck-boost converter of FIGS. 2B and 3A and a corresponding timing diagram 350, in accordance with certain aspects of the present disclosure. Much of the circuit diagram 340 of FIG. 3D is similar to the circuit diagram 320 of FIG. 3C, uses the same reference numerals, and will not be described again.

The circuit diagram 340 of FIG. 3D adds a pulse generator 344 and a switch S1. For certain aspects, the circuit diagram 340 may also include control logic 348 (e.g., for implementing a high-impedance (Hi-Z) detection circuit) and a switch S2, as illustrated in FIG. 3D.

Similar to FIG. 3C, an input of the inverter 321 is coupled to the output of the control logic 210 for receiving the HS_CTL signal, and an output of the inverter 321 is coupled to the input of the HS level shifter 302. The pulse generator 344 may be implemented by a one shot circuit (as known as a monostable multivibrator), for example. An input of the pulse generator 344 may be coupled to the output of the HS level shifter 302, and an output of the pulse generator may be coupled to an input of the pulldown driver 326. The outputs of the pullup driver 324 and the pulldown driver 326 are coupled to the gate of transistor M0.

In contrast with the circuit diagram 320 of FIG. 3C, the HS level shifter 302, the pulse generator 344, and the pulldown driver 326 of FIG. 3D may each have power supply inputs coupled between the floating power supply rail 311 and the output node 232. The inverter 321 and the HS level shifter 302 may also have power inputs coupled between the digital voltage rail (DVDD) and the (digital-domain) electrical ground. In this manner, the HS level shifter 302 can level shift the HS_CTL signal to a first HS pulldown drive signal (labeled "HS_DRV_GS_SW") swinging from Vout to Vfloat,n, as illustrated in the timing diagram 350. Due to the inverter 321, the HS_DRV_GS_SW at the output of the HS level shifter 302 is the inverse of the HS_CTL signal.

The pulse generator 344 is configured to generate an output pulse when a suitable trigger signal is applied. In this case, the pulse generator 344 may be triggered by the rising edge of the HS_DRV_GS_SW signal, causing the pulse generator to output a second HS pulldown drive signal (labeled "HS_DRV_PD") with a single pulse on each rising edge of the HS_DRV_GS_SW signal, as illustrated in the timing diagram 350. The pulses swing from Vout to Vfloat,n, due to the power supply rails coupled to the pulse generator 344.

Similar to FIG. 3C, the HS level shifter 322 and the pullup driver 324 each have power supply inputs coupled between the boosted power supply rail 323 and the input node 227 with Vin. In this manner, the HS level shifter 322 can level shift the HS_CTL signal to a HS pullup drive signal (labeled "HS_DRV_PU") swinging from Vin to CBST, as illustrated in the timing diagram 350, and the HS_DRV_PU signal can control the pullup driver 324 with the correct timing for pulling up the gate of transistor M0 to CBST when HS_CTL (and HS_DRV_PU) are logic high.

Figure 3E:
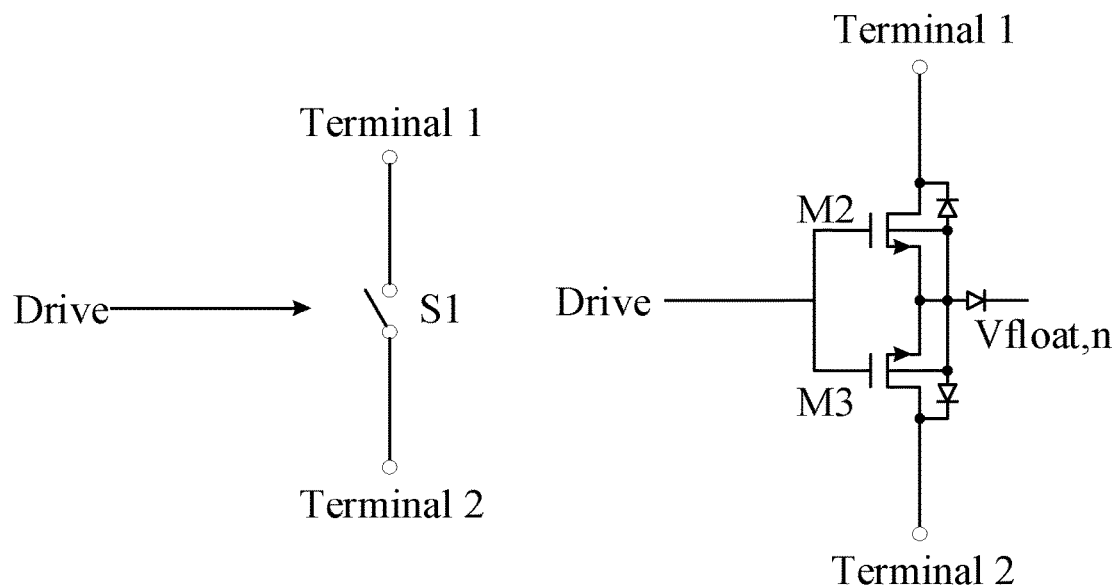
FIG. 3E is a circuit diagram of an example implementation of an auxiliary switch using back-to-back n-channel field-effect transistors (NFETs), in accordance with certain aspects of the present disclosure.

Switch S1 is coupled between the gate and the source of the transistor M0. The control input of switch S1 may be coupled to the output of the HS level shifter 302 (i.e., to the input of the pulse generator 344). For certain aspects, switch S1 may be implemented by back-to-back transistors, such as back-to-back n-type field-effect transistors (NFETs) M2 and M3, as illustrated in FIG. 3E. In this case, the sources of NFETs M2 and M3 may be coupled together, and the gates of NFETs M2 and M3 may be coupled together and to the control input of switch S1, which is labeled "drive" in FIG. 3E. A drain of NFET M2 may be coupled to one terminal (labeled "Terminal 1") of switch S1, and a drain of NFET may be coupled to another terminal (labeled "Terminal 2") of switch S1.

Figure 3F:
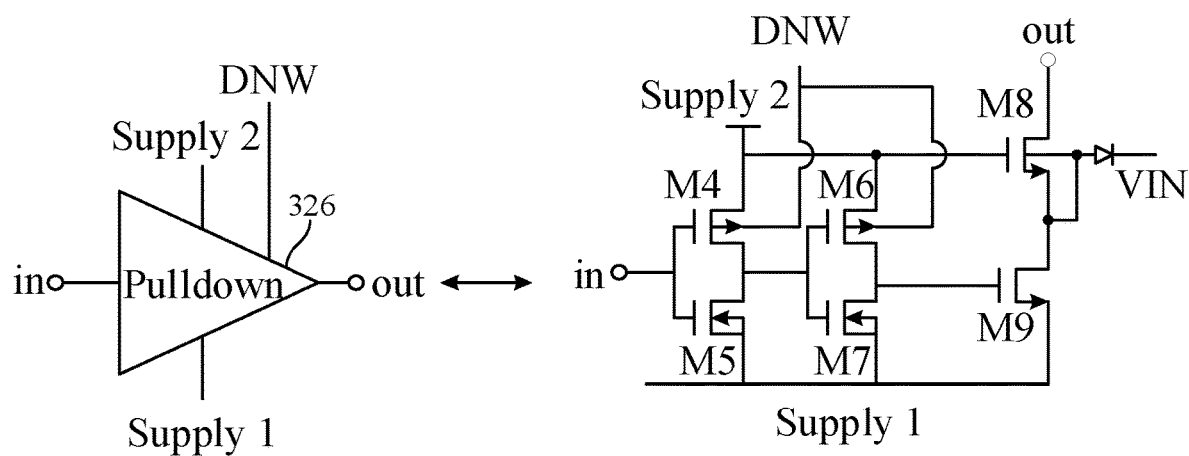
FIG. 3F is a circuit diagram of an example implementation of a pulldown portion of a segmented high-side gate driver, in accordance with certain aspects of the present disclosure.

FIG. 3F is a circuit diagram of an example implementation of the pulldown driver 326, in accordance with certain aspects of the present disclosure. In this example, the pulldown driver 326 is implemented as a first complementary metal-oxide-semiconductor (CMOS) inverter (comprising PFET M4 and NFET M5), a second CMOS inverter (comprising PFET M6 and NFET M7) coupled in series with the first CMOS inverter, and an NFET M9 having a gate coupled to an output of the second CMOS inverter. The input of the pulldown driver 326 may be coupled to gates of PFET M4 and NFET M5 in the first inverter. Drains of PFET M4 and NFET M5 may be coupled together and to gates of PFET M6 and NFET M7 in the second inverter. Drains of PFET M6 and NFET M7 may be coupled together and to the gate of NFET M9. The pulldown driver 326 may also have an NFET M8 having a source and a body coupled to a drain of NFET M9 and having a drain coupled to the output of the pulldown driver. Sources of PFETs M4 and M6 (and the gate of NFET M8) may be coupled to a higher power supply voltage rail (labeled "Supply 2"), and sources of NFETs M5, M7, and M9 may be coupled to a lower power supply voltage rail (labeled "Supply 1"). A deep n-well bias voltage (labeled "DNW," which may be the output of a DNW bias circuit 306) may be coupled to bodies of PFETs M4 and M6. Although shown as a deep n-well bias voltage in FIG. 3F, this may alternatively be replaced with a deep p-well bias voltage, depending on the semiconductor process used to implement the pulldown driver circuit. With this implementation of the pulldown driver 326 in FIG. 3F, a logic high signal applied to the input of the pulldown driver will pull the output low (to the Supply 1 level), whereas a logic low signal applied to the input will present a high impedance (off) to the output.

As described above, the high-side pulldown path (with the pulse generator 344, the pulldown driver 326, and switch S1) may pull down the gate voltage of transistor M0 using a two-step transition. When the HS_CTL signal transitions from logic high to logic low, the HS_DRV_GS_SW signal transitions from Vout to Vfloat,n. When applying Vfloat,n to the control input of switch S1, the gate of transistor M0 is initially at CBST and the source is initially at Vin, but the goal is to pull down the gate to VSW to fully turn off high-side transistor M0. Switch S1 with its control input at Vfloat,n cannot close initially to short the gate to the source of transistor M0. Therefore, the pulse generator 344 is triggered to output a pulse upon the rising edge of the HS_DRV_GS_SW signal to control the pulldown driver 326. The pulldown driver 326 has a pulldown stage with an n-type transistor having a source coupled to the output node 232 (at Vout). Applying the pulse at Vfloat,n to the gate of the pulldown n-type transistor in the pulldown driver 326 will pull charge from the gate of transistor M0, such that the pulldown n-type transistor acts as a first discharge path 352 and the gate voltage of transistor M0 will fall toward Vout.

Switch S1 will start to close (e.g., the back-to-back n-channel transistors turn on) once VSW or the gate voltage of transistor M0 fall below Vfloat,n, and the gate of transistor M0 will be effectively shorted to the switching node 228 when switch S1 is fully closed (e.g., the gate-to-source voltage of the back-to-back transistors is sufficiently high, such as higher than the threshold voltage). Closing switch S1 ensures the gate voltage of transistor M0 follows VSW to turn off transistor M0 and also forms a second discharge path 354 from the gate of transistor M0 through switch S1. Depending on the pulse length from the pulse generator 344, the discharge paths 352, 354 may be concurrently discharging for a short period. The pulse length should be set long enough to ensure the gate voltage of transistor M0 is pulled down below Vfloat,n before the end of the pulse on the HS_DRV_PD signal, turning off the pulldown driver 326.

For certain aspects, a closed-loop approach to initially pulling down the gate voltage of transistor M0 may be used, instead of relying on a fixed pulse length of the HS_DRV_PD signal, as set by the pulse generator 344. In this case, the gate voltage of the high-side transistor M0 may be sensed, and the application of Vfloat,n by the pulldown driver 326 may end when the gate voltage is at a predefined voltage below Vfloat,n. This may help to ensure the discharge path 352 is on long enough such that switch S1 can be activated to discharge the remaining voltage on the gate of transistor M0.

This gate drive architecture and two-step approach of FIG. 3D have several advantages. For example, closing switch S1 as described above ensures that transistor M0 is completely turned off when HS_CTL is logic low, even in the case where VSW becomes more negative than Vout due to a substantial voltage drop across the low-side transistor M1 (e.g., in the case of a high load current). Also, by referencing the high-side pulldown path (in step one of the transition) to Vout instead of VSW, the pulldown path is referenced to a stable voltage, rather than a changing voltage, and the design of the high-side pulldown path is much easier, without a bootstrap capacitor Cboot. Eliminating capacitor Cboot reduces the area occupied by the power supply circuit and avoids the problems described above with respect to capacitor Cboot (e.g., recharging). Moreover, the HS level shifter 302 being powered from a stable Vfloat,n domain rather than the more temperamental Vboot domain may make the design of the HS level shifter much easier.

Furthermore, the output of the DNW bias circuit 306 may be coupled to a transistor body input of the pulldown driver 326 (e.g., the PMOS body input of FIG. 3B or the body inputs of PFETs M4 and M6 in FIG. 3F). Because Vfloat,n and Vout are stable voltages (as compared to the shifting Vboot domain), the output of the DNW bias circuit 306 need not slew up and down very quickly to track a moving voltage, such as VSW. Therefore, the design of the DNW bias circuit 306 may be simpler than previous implementations.

For certain aspects, the gate driver architecture may also include another auxiliary switch S2 and control logic 348 for controlling switch S2, to address an additional complication that occurs, in some cases, in the circuit diagram 340 of FIG. 3D, for example. Switch S2 may be coupled between the gate and the source of high-side transistor M0, and an output of the control logic 348 may be coupled to a control input of switch S2. Switch S2 may be implemented by back-to-back NFETs, similar to the example implementation of switch S1 depicted in FIG. 3E. However, switch S2 may be driven by a positive voltage (e.g., Vin) from the control logic 348 to close switch S2 and from a negative voltage (e.g., Vout) to open switch S2. For certain aspects, the control logic 348 may be part of the control logic 210, whereas in other aspects, the control logic 348 may be physically separate from the control logic 210.

The control logic 348 may include or may be a portion of a high-impedance (Hi-Z) detection circuit, which is configured to determine when the switching node 228 (or the source of transistor M0) enters a high-impedance state, such as when the SMPS circuit is disabled, when the SMPS circuit is in a discontinuous mode (DCM) or pulse-skipping mode, or when both the transistors M0 and M1 are supposed to be turned off.

Most of the time, switch S2 is open. However, when the gate driver enters the high-impedance state and both power transistors M0 and M1 are turned off, there is a DC short from the switching node 228 to ground (i.e., VSW=0 V) via the inductive element L1. To keep transistor M0 off in this scenario using switch S1 in a closed state, the control input of switch S1 should be higher than 0 V (e.g., by at least the threshold voltage (Vth) of the back-to-back NFETs). However, the control signal HS_DRV_GS_SW for switch S1 may operate in the negative voltage domain (e.g., between Vout and Vfloat,n), which cannot ensure that switch S1 is closed. In other words, switch S1 may not be able to keep transistor M0 off when Vfloat,n<Vth.

Therefore, when the SMPS circuit enters DCM mode (or another high-impedance state) and, in some cases, the control logic determines that the low-side transistor M1 is shut off (e.g., using a zero-crossing detector in the control logic 348 or based on the LS_CTL from control logic 210), the control logic 348 may determine that the switching node 228 has entered a high-impedance state. Therefore, the control logic 348 may apply a positive voltage (e.g., from the DVDD rail, the input node 227 (with Vin), or another power supply rail powering the control logic 348) to the control input of switch S2, thereby closing switch S2 and shorting the gate and the source of high-side transistor M0, thus keeping transistor M0 turned off.

Figure 4:
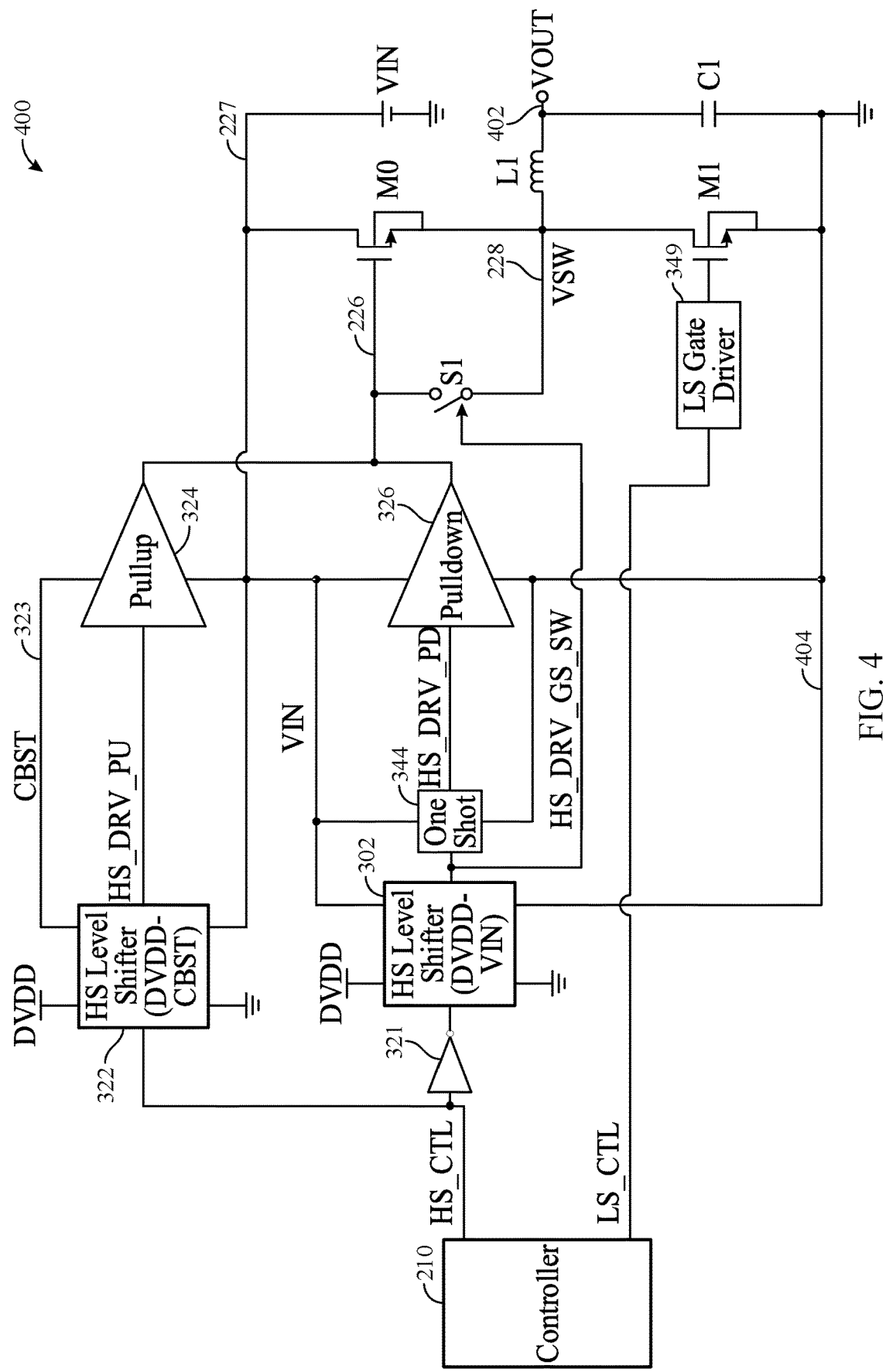
FIG. 4 is a circuit diagram of an example gate driver architecture for a buck converter, using a pulse generator and an auxiliary switch, in accordance with certain aspects of the present disclosure.

In this case, pulling down the gate voltage of the high-side transistor M0 may be considered to involve three steps. The first step may be to pull down VSW towards Vout using the pulse generator 344, the second step may be shorting the gate to the source of transistor M0 using switch S1, and the third step, if in a high-impedance condition during a switching cycle, is to short the gate to the source of the transistor M0 using switch S2. As described above, switch S2 may not be frequently triggered and may remain open in most cases, but for light-load conditions (and other high-impedance scenarios), The techniques and apparatus described above (e.g., with respect to FIG. 3D) for implementing a two-step transition for pulling down the gate voltage of the high-side transistor M0 may also be applied to other switching converter topologies, such as for a buck converter. FIG. 4 is a circuit diagram 400 of an example gate driver architecture for a buck converter, with the pulse generator 344 and switch S1, in accordance with certain aspects of the present disclosure. Much of the circuit diagram 400 of FIG. 4 is similar to the circuit diagram 340 of FIG. 3D, uses the same reference numerals, and will not be described again. In FIG. 4, an LS gate drive path 349 may represent the LS level shifter 303 and the LS gate driver 305 of FIGS. 3A, 3C, and 3D, for example.

In a buck converter, an output node 402 (with positive output voltage Vout) is coupled to the inductive element L1 and the capacitive element C1, and the low-side transistor M1 and the capacitive element are referenced to a reference potential node 404 (e.g., electrical ground) for the buck converter, as illustrated in FIG. 4. Due to these differences between the buck converter and the inverting buck-boost converter, there are some differences between the gate driver implementation for the buck converter of FIG. 4 and the gate driver implementation for the inverting buck-boost converter of FIG. 3D. For example, the HS level shifter 302, the pulse generator 344, and the HS pulldown gate driver 326 each have power supply inputs coupled between the input node 227 (with Vin) and the reference potential node 404. Therefore, the HS_DRV_GS_SW signal and the HS_DRV_PD signals swing between Vin and 0 V, rather than between Vfloat,n and Vout. Also, since Vin is a positive voltage higher than Vout and because the common-mode voltage for a buck converter is Vout, switch S2 and control logic 348 for detecting a high-impedance state and the floating rail generator 301 need not be included. Furthermore, since Vin is already available and provides a stable voltage for powering the components in the high-side pulldown path, the floating rail generator 301 need not be included. Additionally, a bootstrap capacitor need not be used.

In this case, the high-side pullup gate driver 324 can turn on transistor using CBST, as described above. When transistor M0 should be turned off, the two-step approach is used, where the pulse generator 344 generates a pulse with amplitude Vin in the HS_DRV_PD signal, which turns on the n-type transistor in the pulldown driver 326 and creates a discharge path for the gate of transistor M0 to be pulled down towards 0 V. Once the gate voltage of transistor M0 becomes sufficiently lower than Vin, the HS_DRV_GS_SW at Vin can close switch S1, shorting the gate and source of transistor M0 and turning off this high-side transistor.

As presented above, certain aspects of the present disclosure provide a switched-mode power supply (SMPS) circuit. The SMPS circuit generally includes a high-side n-channel transistor, a segmented gate driver (also referred to as a "split driver") for the high-side n-channel transistor, and a two-stage pulldown path. The first stage may pull down to the output (or ground), and the second stage may pull down to the switching node.

Example Operations for Supplying Power

Figure 5:
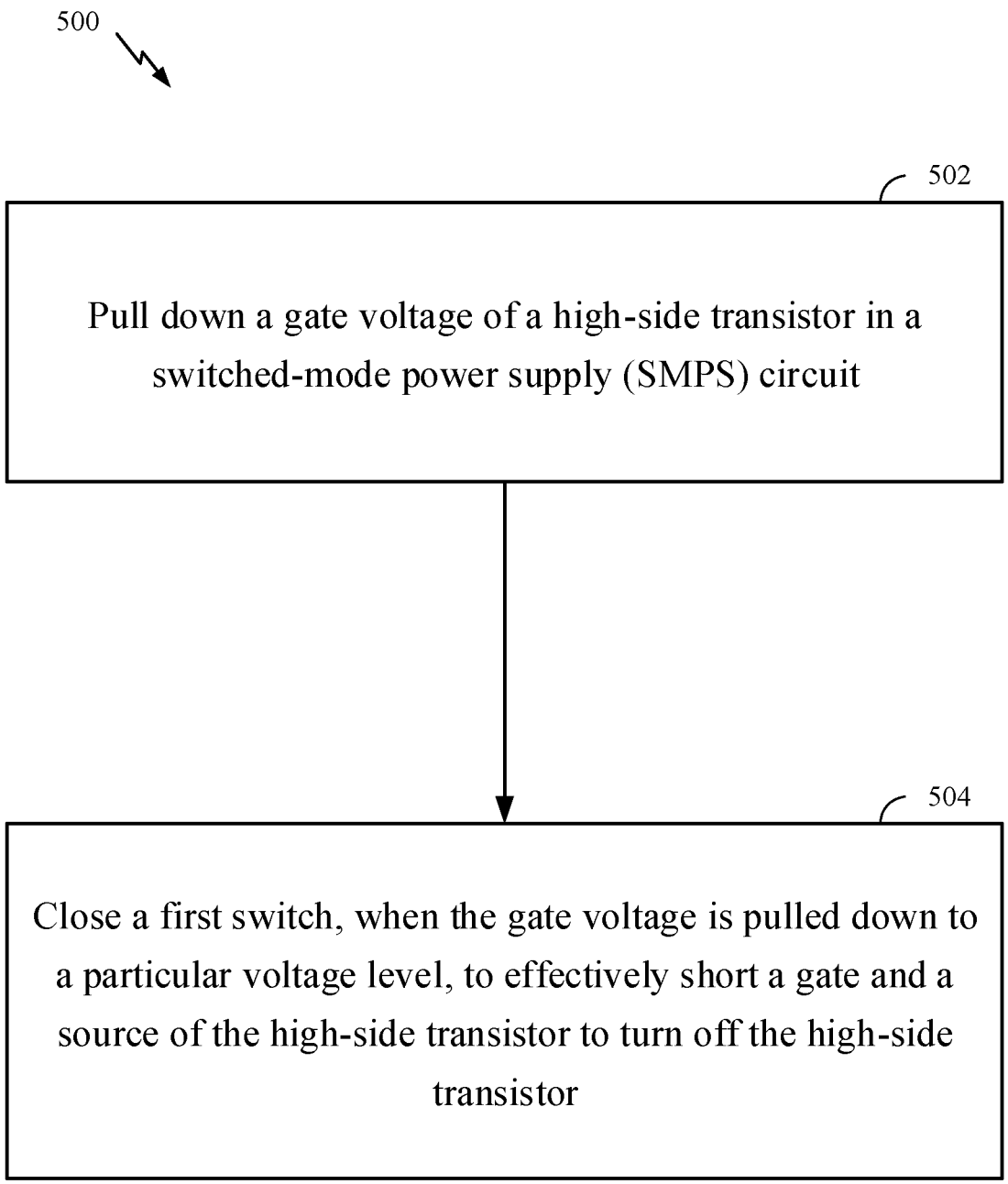
FIG. 5 is a flow diagram of example operations for supplying power, in accordance with certain aspects of the present disclosure.

FIG. 5 is a flow diagram of example operations 500 for supplying power, in accordance with certain aspects of the present disclosure. The operations 500 may be performed by a switched-mode power supply (SMPS) circuit with a pulse generator and one or more auxiliary switches, such as the SMPS circuits with circuit diagrams 340 and 400 having the pulse generator 344 and switches S1 and S2 of FIGS. 3D and 4.

The operations 500 may begin, at block 502, by pulling down a gate voltage of a high-side transistor (e.g., transistor M0) in the SMPS circuit. When the gate voltage is pulled down to a particular voltage level (e.g., a threshold voltage below Vfloat,n or Vin), a first switch (e.g., switch S1) is closed at block 504 to effectively short a gate and a source of the high-side transistor to turn off the high-side transistor.

According to certain aspects, the pulling down at block 502 involves generating a pulse (e.g., in HS_DRV_PD) for turning on an n-type transistor (not shown) in a pulldown gate driver (e.g., HS pulldown gate driver 326). For certain aspects, the SMPS circuit comprises an inverting buck-boost converter, and the pulldown gate driver may be referenced to an output voltage (e.g., Vout) of the inverting buck-boost converter. In this case, the pulse may be generated from a pulse generator (e.g., pulse generator 344); the pulse generator and the pulldown gate driver may receive power from a floating power supply source (e.g., the floating rail generator 301) at a floating voltage (e.g., Vfloat,n); the floating power supply source may be referenced to the output voltage of the inverting buck-boost converter; and the particular voltage level may be a transistor threshold voltage (Vth) lower than the floating voltage of the floating power supply source. For other aspects, the SMPS circuit comprises a buck converter, and the pulldown gate driver may be referenced to a reference potential for the buck converter. In this case, the pulse may be generated from a pulse generator; the pulse generator and the pulldown gate driver may receive power from an input voltage source at an input voltage (e.g., Vin); the input voltage source is referenced to the reference potential (e.g., electrical ground at 0 V) for the buck converter; and the particular voltage level is a transistor threshold voltage (e.g., Vth) lower than the input voltage of the input voltage source.

According to certain aspects, the operations 500 may further include receiving a control signal (e.g., HS_DRV_GS_SW) from a level shifter (e.g., the HS level shifter 302). In this case, the pulse generator may be a one-shot pulse generator, and the generating may involve triggering generation of the pulse based on a rising edge of the control signal from the level shifter.

According to certain aspects, the operations 500 may further include determining the SMPS circuit is in a discontinuous conduction mode (DCM), the source of the high-side transistor is in a high-impedance (Hi-Z) state, or the SMPS circuit is disabled. Based on the determination, a second switch (e.g., switch S2) may be closed to short the gate to the source of the high-side transistor.

Example Aspects

In addition to the various aspects described above, specific combinations of aspects are within the scope of the disclosure, some of which are detailed below:

Aspect 1: A switched-mode power supply (SMPS) circuit comprising: a high-side transistor; a pulldown gate driver having an output coupled to a gate of the high-side transistor; a pulse generator having an output coupled to an input of the pulldown gate driver; and a first switch coupled between the gate and a source of the high-side transistor.

Aspect 2: The SMPS circuit of Aspect 1, further comprising a first level shifter having an output coupled to an input of the pulse generator.

Aspect 3: The SMPS circuit of Aspect 2, wherein the output of the first level shifter is further coupled to a control input of the first switch.

Aspect 4: The SMPS circuit of any of Aspects 1 to 3, further comprising: a second switch coupled between the gate and the source of the high-side transistor; and control logic having an output coupled to a control input of the second switch.

Aspect 5: The SMPS circuit of Aspect 4, wherein the control logic is configured to close the second switch when at least one of: the SMPS circuit is in a discontinuous conduction mode (DCM), the source of the high-side transistor is in a high-impedance state, or the SMPS circuit is disabled.

Aspect 6: The SMPS circuit of any of Aspects 2 to 5, wherein: the SMPS circuit comprises an inverting buck-boost converter including the high-side transistor; the inverting buck-boost converter further comprises an input voltage node coupled to a drain of the high-side transistor, an output voltage node, and a low-side transistor having a drain coupled to the source of the high-side transistor at a switching node and having a source coupled to the output voltage node; the SMPS circuit further comprises a voltage source coupled between the output voltage node and a floating power supply rail; and the first level shifter, the pulse generator, and the pulldown gate driver each have a first power supply input coupled to the floating power supply rail and a second power supply input coupled to the output voltage node.

Aspect 7: The SMPS circuit of Aspect 6, wherein the SMPS circuit further comprises: a pullup gate driver having an output coupled to the gate of the high-side transistor; and a second level shifter having an output coupled to the input of the pullup gate driver, wherein the second level shifter and the pullup gate driver each have a first power supply input coupled to a power supply rail referenced to the input voltage node and a second power supply input coupled to the input voltage node.

Aspect 8: The SMPS circuit of Aspect 6 or 7, wherein the pulse generator is configured to output a pulse having a width that is greater than a transition of a gate voltage at the gate of the high-side transistor from an input voltage at the input voltage node to an output voltage at the output voltage node.

Aspect 9: The SMPS circuit of any of Aspects 6 to 8, wherein the SMPS circuit lacks a bootstrap capacitor selectively coupled between the floating power supply rail and the switching node.

Aspect 10: The SMPS circuit of any of Aspects 6 to 9, wherein the first switch is implemented as back-to-back n-channel transistors, such that the first switch is configured to be closed when a gate voltage of the high-side transistor is lower than a voltage of the floating power supply rail by at least a threshold voltage of one of the back-to-back n-channel transistors.

Aspect 11: The SMPS circuit of any of the preceding Aspects, further comprising a deep n-well bias circuit having an output coupled to a transistor body input of the pulldown gate driver.

Aspect 12: The SMPS circuit of any of Aspects 1 to 3, wherein: the SMPS circuit comprises a buck converter including the high-side transistor and having an input voltage node coupled to a drain of the high-side transistor; and the first level shifter, the pulse generator, and the pulldown gate driver each have a first power supply input coupled to the input voltage node and a second power supply input coupled to a reference potential node of the SMPS circuit.

Aspect 13: The SMPS circuit of Aspect 12, wherein the SMPS circuit further comprises: a pullup gate driver having an output coupled to the gate of the high-side transistor; and a second level shifter having an output coupled to the input of the pullup gate driver, wherein the second level shifter and the pullup gate driver each have a first power supply input coupled to a power supply rail referenced to the input voltage node and a second power supply input coupled to the input voltage node.

Aspect 14: The SMPS circuit of Aspect 12 or 13, wherein the first switch is implemented as back-to-back n-channel transistors, such that the first switch is configured to be closed when a gate voltage of the high-side transistor is lower than a voltage of the input voltage node by at least a threshold voltage of one of the back-to-back n-channel transistors.

Aspect 15: The SMPS circuit of any of Aspects 2 to 14, wherein the pulse generator comprises a one-shot pulse generator configured to output a pulse triggered based on a rising edge of an output signal from the first level shifter.

Aspect 16: A power management integrated circuit (PMIC) comprising at least a portion of the SMPS circuit of any of the preceding Aspects.

Aspect 17: A method of supplying power, comprising: pulling down a gate voltage of a high-side transistor in a switched-mode power supply (SMPS) circuit; and when the gate voltage is pulled down to a particular voltage level, closing a first switch to effectively short a gate and a source of the high-side transistor to turn off the high-side transistor.

Aspect 18: The method of Aspect 17, wherein the pulling down comprises generating a pulse for turning on an n-type transistor in a pulldown gate driver.

Aspect 19: The method of Aspect 18, wherein the SMPS circuit comprises an inverting buck-boost converter and wherein the pulldown gate driver is referenced to an output voltage of the inverting buck-boost converter.

Aspect 20: The method of Aspect 19, wherein: the pulse is generated from a pulse generator; the pulse generator and the pulldown gate driver receive power from a floating power supply source at a floating voltage; the floating power supply source is referenced to the output voltage of the inverting buck-boost converter; and the particular voltage level is a transistor threshold voltage lower than the floating voltage of the floating power supply source.

Aspect 21: The method of Aspect 18, wherein the SMPS circuit comprises a buck converter and wherein the pulldown gate driver is referenced to a reference potential for the buck converter.

Aspect 22: The method of Aspect 21, wherein: the pulse is generated from a pulse generator; the pulse generator and the pulldown gate driver receive power from an input voltage source at an input voltage; the input voltage source is referenced to the reference potential for the buck converter; and the particular voltage level is a transistor threshold voltage lower than the input voltage of the input voltage source.

Aspect 23: The method of Aspect 22, further comprising receiving a control signal from a level shifter, wherein the pulse generator comprises a one-shot pulse generator and wherein the generating comprises triggering generation of the pulse based on a rising edge of the control signal from the level shifter.

Aspect 24: The method of any of Aspects 17 to 23, further comprising: determining the SMPS circuit is in a discontinuous conduction mode (DCM), the source of the high-side transistor is in a high-impedance state, or the SMPS circuit is disabled; and based on the determination, closing a second switch to short the gate to the source of the high-side transistor.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A switched-mode power supply (SMPS) circuit comprising:
   a buck converter including a high-side transistor having a drain coupled to an input voltage node;
   a pulldown gate driver having an output coupled to a gate of the high-side transistor;

a pulse generator having an output coupled to an input of the pulldown gate driver; and a first switch coupled between the gate and a source of the high-side transistor, wherein the pulse generator and the pulldown gate driver each have a first power supply input coupled to a reference potential node of the SMPS circuit;

a first level shifter having an output coupled to an input of the pulse and a first power supply input coupled to the reference potential node of the SMPS circuit; and wherein the first level shifter, the pulse generator, and the pulldown gate driver each have a second power supply input coupled to the input voltage node.

2. The SMPS circuit of claim 1, wherein the output of the first level shifter is further coupled to a control input of the first switch.

3. The SMPS circuit of claim 1, further comprising:
a second switch coupled between the gate and the source of the high-side transistor; and
control logic having an output coupled to a control input of the second switch.

4. The SMPS circuit of claim 3, wherein the control logic is configured to close the second switch when at least one of: the SMPS circuit is in a discontinuous conduction mode (DCM), the source of the high-side transistor is in a high-impedance state, or the SMPS circuit is disabled.

5. The SMPS circuit of claim 1, wherein the SMPS circuit further comprises:
a pullup gate driver having an output coupled to the gate of the high-side transistor; and
a second level shifter having an output coupled to the input of the pullup gate driver, wherein the second level shifter and the pullup gate driver each have a first power supply input coupled to a power supply rail referenced to the input voltage node and a second power supply input coupled to the input voltage node.

6. The SMPS circuit of claim 1, wherein the first switch is implemented as back-to-back n-channel transistors, such that the first switch is configured to be closed when a gate voltage of the high-side transistor is lower than a voltage of the input voltage node by at least a threshold voltage of one of the back-to-back n-channel transistors.

7. The SMPS circuit of claim 1, wherein the pulse generator comprises a one-shot pulse generator configured to output a pulse triggered based on a rising edge of an output signal from the first level shifter.

8. A switched-mode power supply (SMPS) circuit comprising:
an inverting buck-boost converter comprising:
a high-side transistor;
an input voltage node coupled to a drain of the high-side transistor;
an output voltage node; and
a low-side transistor having a drain coupled to the source of the high-side transistor at a switching node and having a source coupled to the output voltage node;
a pulldown gate driver having an output coupled to a gate of the high-side transistor, wherein the pulldown gate driver is referenced to an output voltage of the inverting buck-boost converter;
a pulse generator having an output coupled to an input of the pulldown gate driver;
a switch coupled between the gate and a source of the high-side transistor;
a first level shifter having an output coupled to an input of the pulse generator;

a voltage source coupled between the output voltage node and a floating power supply rail; and
the first level shifter, the pulse generator, and the pulldown gate driver each have a first power supply input coupled to the floating power supply rail and a second power supply input coupled to the output voltage node.

9. The SMPS circuit of claim 8, wherein the SMPS circuit further comprises:
a pullup gate driver having an output coupled to the gate of the high-side transistor; and
a second level shifter having an output coupled to the input of the pullup gate driver, wherein the second level shifter and the pullup gate driver each have a first power supply input coupled to a power supply rail referenced to the input voltage node and a second power supply input coupled to the input voltage node.

10. The SMPS circuit of claim 8, wherein the pulse generator is configured to output a pulse having a width that is greater than a transition of a gate voltage at the gate of the high-side transistor from an input voltage at the input voltage node to an output voltage at the output voltage node.

11. The SMPS circuit of claim 8, wherein the SMPS circuit lacks a bootstrap capacitor selectively coupled between the floating power supply rail and the switching node.

12. The SMPS circuit of claim 8, wherein the switch is implemented as back-to-back n-channel transistors, such that the switch is configured to be closed when a gate voltage of the high-side transistor is lower than a voltage of the floating power supply rail by at least a threshold voltage of one of the back-to-back n-channel transistors.

13. The SMPS circuit of claim 8, further comprising a deep n-well bias circuit having an output coupled to a transistor body input of the pulldown gate driver.

14. The SMPS circuit of claim 8, further comprising a level shifter having an output coupled to an input of the pulse generator, wherein the output of the level shifter is further coupled to a control input of the switch.

15. A method of supplying power, comprising:
pulling down a gate voltage of a high-side transistor in a switched-mode power supply (SMPS) circuit, wherein the pulling down comprises generating a pulse, from a pulse generator, for turning on an n-type transistor in a pulldown gate driver, wherein the SMPS circuit comprises a buck converter, and wherein the pulldown gate driver is referenced to a reference potential for the buck converter;
when the gate voltage is pulled down to a particular voltage level lower than the input voltage of an input voltage source referenced to a reference potential for the buck converter, closing a first switch to effectively short a gate and a source of the high-side transistor to turn off the high-side transistor; and
wherein the pulse generator and the pulldown gate driver receive power from the input voltage source.

16. The method of claim 15, further comprising receiving a control signal from a level shifter, wherein the pulse generator comprises a one-shot pulse generator and wherein the generating comprises triggering generation of the pulse based on a rising edge of the control signal from the level shifter.

17. The method of claim 15, further comprising:
determining the SMPS circuit is in a discontinuous conduction mode (DCM), the source of the high-side transistor is in a high-impedance state, or the SMPS circuit is disabled; and based on the determination, closing a second switch to short the gate to the source of the high-side transistor.

18. A method of supplying power, comprising:

pulling down a gate voltage of a high-side transistor in a switched-mode power supply (SMPS) circuit, wherein the pulling down comprises generating a pulse from a pulse generator for turning on an n-type transistor in a pulldown gate driver, wherein the SMPS circuit comprises an inverting buck-boost converter, and wherein the pulldown gate driver is referenced to an output voltage of the inverting buck-boost converter; and when the gate voltage is pulled down to a particular voltage level lower than a floating voltage of a floating power supply source referenced to the output voltage of the inverting buck boost converter, closing a first switch to effectively short a gate and a source of the high-side transistor to turn off the high-side transistor; and wherein:

the pulse generator and the pulldown gate driver receive power from the floating power supply source.

\* \* \* \* \*